(12) United States Patent
Arai et al.

(10) Patent No.: US 7,157,946 B2
(45) Date of Patent: Jan. 2, 2007

(54) CHOPPER COMPARATOR CIRCUIT

(75) Inventors: Mitsuru Arai, Tokyo (JP); Mamoru Kondo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/734,621

(22) Filed: Dec. 15, 2003

(65) Prior Publication Data

US 2005/0017770 A1   Jan. 27, 2005

(30) Foreign Application Priority Data

Jul. 23, 2003  (JP)  .............................. 2003/278139
Sep. 5, 2003  (JP)  .............................. 2003/314644

(51) Int. Cl.
*H03K 5/22* (2006.01)

(52) U.S. Cl. ........................... 327/77; 327/124; 327/87

(58) Field of Classification Search ................. 327/77, 327/72, 74, 76, 78, 85, 87, 88, 89, 91, 93–97, 327/124

See application file for complete search history.

(56) References Cited

U.S. PATENT DOCUMENTS 5,329,172 A * 7/1994 Kohdaka ..................... 327/63
5,936,434 A * 8/1999 Kumamoto et al. .......... 327/77
6,271,691 B1 * 8/2001 Toyoda et al. ................ 327/77

FOREIGN PATENT DOCUMENTS

| JP | 7-264018 | * 10/1995 |
| JP | 10-65502 | 3/1998 |
| JP | 10-256884 | 9/1998 |
| JP | 11-312969 | 11/1999 |

* cited by examiner

*Primary Examiner*—Long Nguyen
(74) *Attorney, Agent, or Firm*—Rabin & Berdo, P.C.

(57) ABSTRACT

The conventional chopper comparator circuit has had high power consumption because the gain thereof used to be set high, so that there has been the need for cutting down on power consumption. In view of the problem described, there is provided a chopper comparator circuit having input terminals 11, 13, capacitors C11, C13, switches SW11, SW13, SW15, SW17, one to a plurality of inverter circuitries disposed behind the capacitors C11, C13, respectively, and an output terminal; the respective comprise one to a plurality of gated inverters 115, 117, 119, 121, each comprising a first logic circuit transistor of a first conductivity type, a second logic circuit transistor of a second conductivity type, a first current control transistor of the first conductivity type, and a second current control transistor of the second conductivity type, wherein the first logic circuit transistor and the second logic circuit transistor are connected in series, the first logic circuit transistor has a main electrode connected to a first power supply line via the first current control transistor, and the second logic circuit transistor has a main electrode connected to a second power supply line via the second current control transistor.

8 Claims, 10 Drawing Sheets

CIRCUIT DIAGRAM SHOWING A CONFIGURATION
OF A CHOPPER COMPARATOR CIRCUIT
ACCORDING TO A FIRST EMBODIMENT

CIRCUIT DIAGRAM SHOWING A CONFIGURATION OF A CHOPPER COMPARATOR CIRCUIT ACCORDING TO A FIRST EMBODIMENT

CIRCUIT DIAGRAM SHOWING ANOTHER CONFIGURATION OF A CHOPPER COMPARATOR CIRCUIT ACCORDING TO THE FIRST EMBODIMENT

OPERATIONAL DIAGRAM SHOWING THE OPERATION OF THE CHOPPER COMPARATOR CIRCUIT ACCORDING TO THE FIRST EMBODIMENT

| Input terminal 11(X), Input terminal 13(Y) | Gain ratio |
|---|---|
| 0, 0 | Power down |
| 0, 1 | 1 |
| 1, 0 | 2 |
| 1, 1 | 3 |

TABLE INDICATING THE OPERATION
OF THE CHOPPER COMPARATOR CIRCUIT
ACCORDING TO THE FIRST EMBODIMENT

CIRCUIT DIAGRAM SHOWING A CONFIGURATION
OF A CONVENTIONAL CHOPPER COMPARATOR CIRCUIT

CIRCUIT DIAGRAM SHOWING ANOTHER CONFIGURATION OF THE CONVENTIONAL CHOPPER COMPARATOR CIRCUIT

CIRCUIT DIAGRAM SHOWING A CONFIGURATION OF A CHOPPER COMPARATOR CIRCUIT ACCORDING TO A SECOND EMBODIMENT

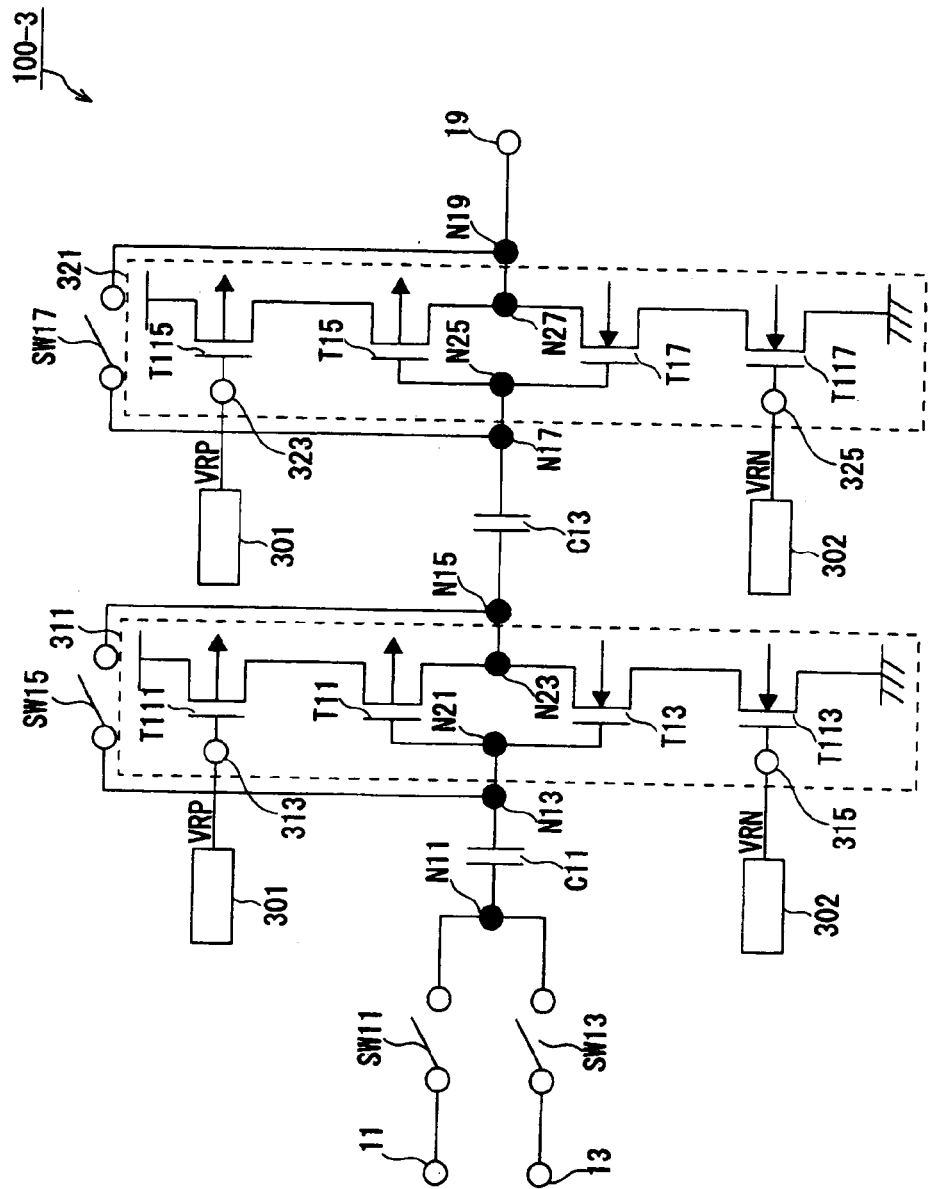
FIG. 4-1 CIRCUIT DIAGRAM SHOWING A CONFIGURATION OF A CHOPPER COMPARATOR CIRCUIT ACCORDING TO A THIRD EMBODIMENT

CIRCUIT DIAGRAM SHOWING A CONFIGURATION
OF A REFERENCE VOLTAGE CIRCUIT

CIRCUIT DIAGRAM SHOWING A CONFIGURATION
OF ANOTHER REFERENCE VOLTAGE CIRCUIT

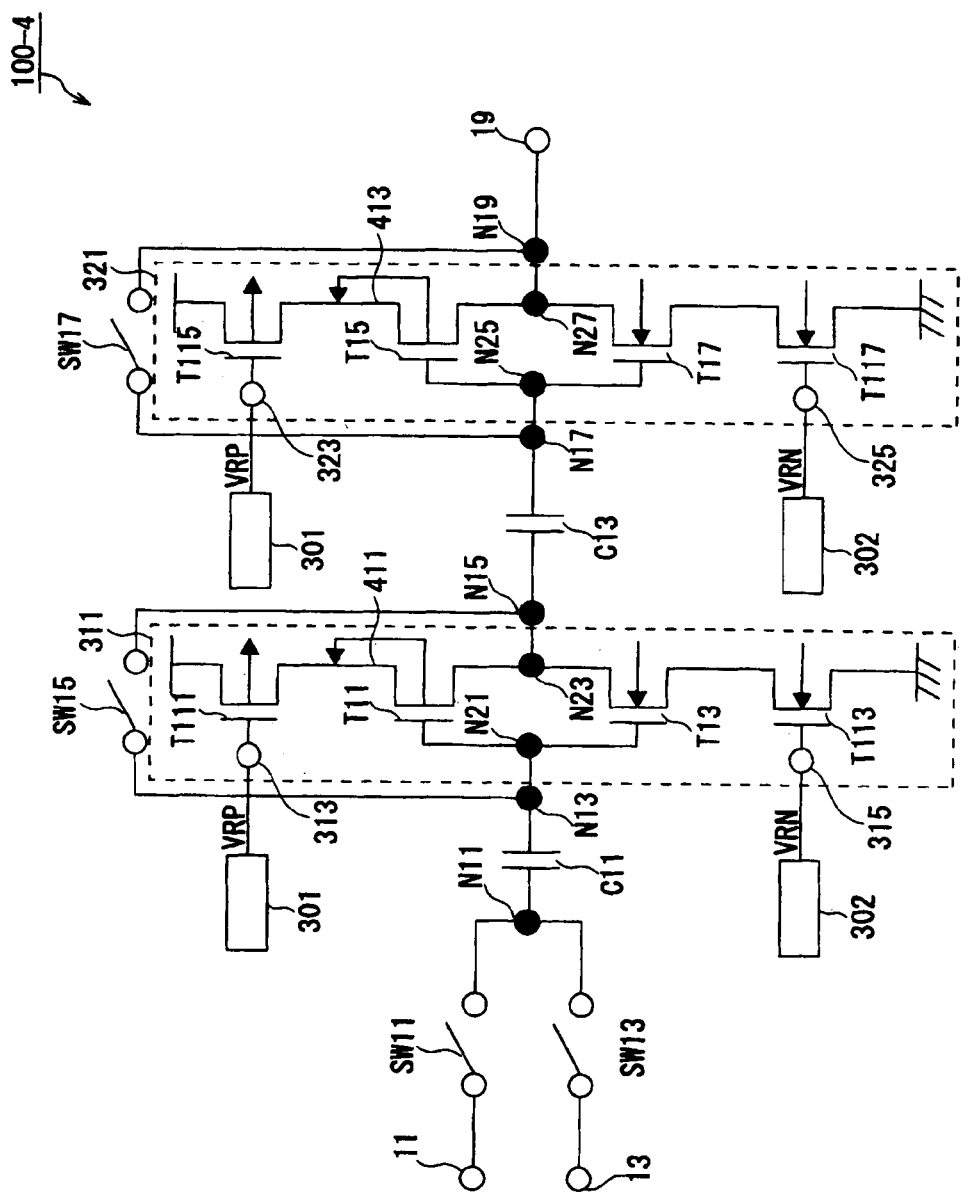

CIRCUIT DIAGRAM SHOWING A CONFIGURATION OF A CHOPPER COMPARATOR CIRCUIT ACCORDING TO A FIFTH EMBODIMENT

US 7,157,946 B2

CHOPPER COMPARATOR CIRCUIT

FIELD OF THE INVENTION

The present invention relates to a chopper comparator circuit for use in, for example, a CMOS semiconductor circuit.

BACKGROUND OF THE INVENTION

For an analog-to-digital converter (hereinafter referred to as an ADC) built in a CMOS semiconductor circuit, use is heavily made of an analog voltage level comparator, that is, a so-called chopper comparator circuit. FIG. 2-1 shows a configuration of a conventional chopper comparator circuit. Further, FIG. 2-2 shows the configuration thereof in detail. Herein, there is described the configuration thereof, having two inverter circuitries, however, there can be a case of the configuration having three inverter circuitries.

A chopper comparator circuit 10 has an input terminal 11 for receiving an analog input voltage $V_{in}$, and an input terminal 13 for receiving a reference voltage $V_{ref}$. The input terminal 11 is connected to a node N11 via a first switch SW11 made up of an analog switch. The input terminal 13 is connected to the node N11 via a second switch SW13 made up of an analog switch. A first capacitor C11 extends between the node N11 and a node N13. The node N13 is connected to a node N15 via a first CMOS inverter 15 that is a first inverter circuitry, and also via a third switch SW15 made up of an analog switch. As shown in FIG. 2-2, the first CMOS inverter 15 comprises a p-channel MOS transistor (hereinafter referred to as a PMOS transistor) T11 and an n-channel MOS transistor (hereinafter referred to as an NMOS transistor) T13. The PMOS transistor T11 has a gate connected to the node 13 via a node N21, a source connected to the plus side of a power source Vdd, and a drain connected to a node N15 via a node N23. The NMOS transistor T13 has a gate connected to the node 13 via the node N21, a drain connected to the node N15 via the node N23, and a source connected to the ground. A second capacitor C13 extends between the node N15 and a node N17. The node N17 is connected to a node N19 via a second CMOS inverter 17 that is a second inverter circuitry, and also via a fourth switch SW17 made up of an analog switch. As shown in FIG. 2-2, the second CMOS inverter 17 comprises a PMOS transistor T15 and an NMOS transistor T17. The PMOS transistor T15 has a gate connected to the node 17, a source connected to the plus side of the power source $V_{dd}$, and a drain connected to the node N19. The NMOS transistor T17 has a gate connected to the node 17, a drain connected to the node N19, and a source connected to the ground. The node N19 is connected to an output terminal 19 for outputting an output voltage $V_{out}$.

The chopper comparator circuit 10 makes use of the first and second CMOS inverters 15, 17 as an amplifier, respectively, while joining the first CMOS inverter 15 with the second CMOS inverter 17 through the intermediary of the second capacitor C13, thereby executing various operations such as offset compensation, comparison, sample hold, and so forth.

The chopper comparator circuit 10 described above normally operates as follows.

First, the first to fourth switches, SW11 to SW17, are caused to operate based on a clock signal (not shown). At the outset, the first, third, and fourth switches, SW11, SW15, and SW17, are turned into the closed (on) condition while the second switch SW13 is turned into the open (off) condition, whereupon a voltage at the node 11 will be $V_{in}$, a voltage at the node N13 will be the threshold voltage $V_{th1}$ of the first CMOS inverter 15, a voltage at the node N15 will be at the same value as that for the node N13 (that is, $V_{th1}$), a voltage at the node N17 will be the threshold voltage $V_{th2}$ of the second CMOS inverter 17, and a voltage at the node N19 will be at the same value as that for the node N17 (that is, $V_{th2}$) to be thereby sent out from the output terminal 19 as the output voltage $V_{out}$.

At this point in time, charge $Q_1$ of the first capacitor C11 is expressed by the following formula (1), and charge $Q_2$ of the second capacitor C13 is expressed by the following formula (2):

$$Q_1 = C_1(V_{in} - V_{th1}) \tag{1}$$

$$Q_2 = C_2(V_{th1} - V_{th2}) \tag{2}$$

where capacitance of the first capacitor C11 is $C_1$ and capacitance of the second capacitor C13 is $C_2$.

Thus, the first capacitor C11 retains a potential difference between the input voltage $V_{in}$ and the threshold voltage $V_{th1}$ of the first CMOS inverter 15 while the second capacitor C13 retains a potential difference in offset voltage between the first CMOS inverter 15 and the second CMOS inverter 17 (that is, a potential difference between the threshold voltage $V_{th1}$ of the first CMOS inverter 15 and the threshold voltage $V_{th2}$ of the second CMOS inverter 17).

Subsequently, the first to fourth switches SW11 to SW17 are caused to operate based on a clock signal (not shown). At this point in time, the first, third, and fourth switches, SW11, SW15, and SW17, are turned into the "off" condition while the second switch SW13 is turned into the "on" condition, whereupon a voltage at the node 11 will be $V_{ref}$, and voltages at the respective nodes, N13, N15, N17, N19, undergo a change. As a result, the chopper comparator circuit 10 sends out the output voltage $V_{out}$ at a value worked out in the following manner from the output terminal 19.

Assuming that a voltage at the node N13 at this point in time is $V_{x1}$, charge $Q_{1'}$ of the first capacitor C11 is expressed by the following formula (3):

$$Q_{1'} = C_1(V_{ref} - V_{x1}) \tag{3}$$

In this case, $Q_1 = Q_{1'}$. Accordingly, based on the formulas (1) and (3), $V_{x1}$ is expressed by the following formula (4):

$$V_{x1} = V_{ref} - V_{in} + V_{th1} \tag{4}$$

Further, assuming that a gain of the first CMOS inverter 15 is $A_1$, a voltage $V_{15}$ at the node N15 is expressed by the following formula (5-1), and based on the formula (4), formula (5-2) is substituted for the formula (5-1) as follows:

$$V_{15} = A_1(V_{x1} - V_{th1}) + V_{th1} \tag{5-1}$$

$$V_{15} = A_1(V_{ref} - V_{in}) + V_{th1} \tag{5-2}$$

Still further, assuming that a voltage at the node N17 is $V_{x2}$, charge $Q_{2'}$ of the second capacitor C13 is expressed by the following formula (6):

$$Q_{2'} = C_2(V_{15} - V_{x2}) \tag{6}$$

Herein, $Q_2 = Q_{2'}$. Accordingly, based on the formulas (2), (6), and (5-2), $V_{x2}$ is expressed by the following formula (7):

$$V_{x2} = A_1(V_{ref} - V_{in}) + V_{th2} \tag{7}$$

Further, assuming that a gain of the second CMOS inverter 17 is $A_2$, the output voltage $V_{out}$ from the node N19 is expressed by the following formula (8-1), and based on the formula (7), formula (8-2) is substituted for the formula (8-1) as follows:

$$V_{out} = A_2(V_{x2} - V_{th2}) + V_{th2} \quad (8\text{-}1)$$

$$V_{out} = A_1 A_2 (V_{ref} - V_{in}) + V_{th2} \quad (8\text{-}2)$$

Thus, the chopper comparator circuit 10 sends out the output voltage $V_{out}$ at a value worked out based on the formula (8-2) from the output terminal 19.

Hence, with the chopper comparator circuit 10, the first CMOS inverter 15 and the second CMOS inverter 17 are caused to operate as an amplifier having a gain of $A_1$, $A_2$, thereby amplifying a potential difference ($V_{ref} - V_{in}$) between the input voltage $V_{in}$ and the reference voltage $V_{ref}$. Thus, the chopper comparator circuit 10 executes comparison operation.

The chopper comparator circuit 10 as described above has been disclosed in, for example, JP, 1998-65502, A (Patent Document 1).

(Patent Document 1) JP, 1998-65502, A (FIG. 9)

With the conventional chopper comparator circuit, since the gain thereof used to be set high, power consumption has increased, so that there has been the need for cutting down on power consumption.

More specifically, because there is, for example, a case where the ADC is put to applications requiring high resolving power, a gain (in other word, the gain of the CMOS inverters 15, 17, respectively) of the chopper comparator circuit 10 is set high in order to enable the ADC to obtain a high gain.

In order that the gain of the CMOS inverters 15, 17, respectively, is set high, however, the transistors T11 through T17, making up the CMOS inverters 15, 17, respectively, need to be enlarged in size. Enlargement in the size of the respective transistors T11 through T17 will result in an increase in the power consumption of the chopper comparator circuit 10. Consequently, there has been the need for cutting down on the power consumption of the chopper comparator circuit 10 of the conventional type.

SUMMARY OF THE INVENTION

The invention has been developed to resolve the problem described and it is therefore an object of the invention to provide a chopper comparator circuit capable of executing high-speed comparison operation by increasing a gain thereof when high resolving power is required, and cutting down on power consumption by decreasing the gain thereof when high resolving power is not required.

The invention provides a chopper comparator circuit having a first input terminal for receiving an analog input voltage, a second input terminal for receiving a reference voltage, one to a plurality of capacitors, a first switch for connecting the first input terminal to the capacitor in the initial stage, a second switch for connecting the second input terminal to the capacitor in the initial stage, one to a plurality of inverter circuitries disposed in respective stages subsequent to one of the capacitors, one to a plurality of switches between input and output terminals for connecting between respective input and output terminals of the inverter circuitries, and an output terminal connected to the inverter circuitry in the final stage, for externally outputting an output voltage; the inverter circuitries each comprising one to a plurality of gated inverters each comprising a first logic circuit transistor of a first conductivity type, a second logic circuit transistor of a second conductivity type, a first current control transistor of the first conductivity type, and a second current control transistor of the second conductivity type, wherein the first logic circuit transistor and the second logic circuit transistor are connected in series, the first logic circuit transistor has a main electrode connected to a first power supply line via the first current control transistor, and the second logic circuit transistor has a main electrode connected to a second power supply line via the second current control transistor.

Since the chopper comparator circuit according to the invention is capable of varying the gain of the circuit in multi-stages, it becomes possible to use the same as appropriate depending on applications by executing high-speed comparison operation by increasing the gain thereof when high resolving power is required, and by cutting down on power consumption by decreasing the gain thereof when high resolving power is not required.

BRIEF DESCRIPTION OF THE DRAWINGS

FIG. 1-2 is a circuit diagram showing another configuration of the first embodiment of the chopper comparator circuit according to the invention;

FIG. 1-3 is an operational diagram showing the operation of the chopper comparator circuit according to the first embodiment of the invention;

FIG. 1-4 shows Table indicating the operation of the chopper comparator circuit according to the first embodiment;

FIG. 2-1 is a circuit diagram showing a configuration of a conventional chopper comparator circuit;

FIG. 2-2 is a circuit diagram showing another configuration of the conventional chopper comparator circuit;

FIG. 3 is a circuit diagram showing a configuration of a chopper comparator circuit according to a second embodiment;

FIG. 4-1 is a circuit diagram showing a configuration of a third embodiment of a chopper comparator circuit according to the invention;

FIG. 4-2 is a circuit diagram showing a configuration of a reference voltage circuit in FIG. 4-1;

FIG. 4-3 is a circuit diagram showing a configuration of another reference voltage circuit in FIG. 4-1;

FIG. 5 is a circuit diagram showing a configuration of a fourth embodiment of a chopper comparator circuit according to the invention.

PREFERRED EMBODIMENTS OF THE INVENTION

Figure 1:
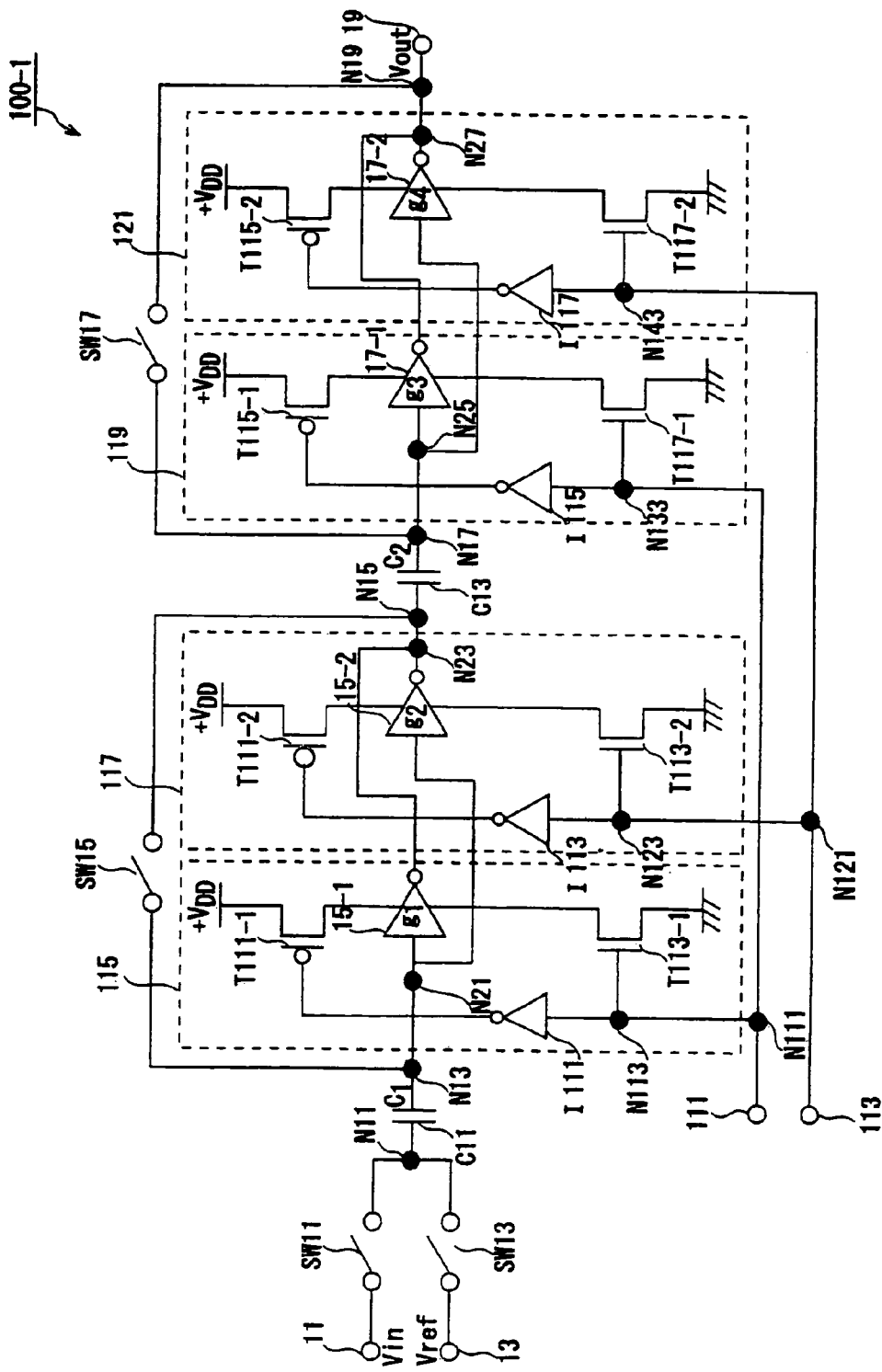
FIG. 1-1 is a circuit diagram showing a configuration of a first embodiment of a chopper comparator circuit according to the invention.

With a chopper comparator circuit according to the invention, current control transistors are connected to both PMOS logic circuit transistors and NMOS logic circuit transistors, respectively, within respective inverter circuitries, thereby enabling a gain and threshold voltage of the respective inverter circuitries to be more finely adjustable.

Incidentally, with the invention disclosed in the Patent Document 1 described above (JP, 1998-65502, A), because attention is focused on a relationship between a conversion rate and power consumption, consideration is not given to a relationship between a gain (conversion accuracy) and power consumption. For this reason, it is impossible to finely adjust the gain and threshold voltage. In contrast, since the present invention has been developed by focusing attention on a relationship between the gain and current consumption, consideration is given to the relationship between the gain (conversion accuracy) and current consumption. Consequently, it is possible to finely adjust the gain and threshold voltage.

Embodiments of the invention are described in detail hereinafter with reference to the accompanying drawings. The respective drawings, however, only broadly show the embodiments to the extent of enabling the invention to be well understood. It is therefore to be pointed out that the scope of the invention is not limited thereto. Elements common to the respective drawings and elements having a similar function, respectively, are denoted by like reference numerals, omitting duplicated description thereof.

First Embodiment

Figures 1, 2:
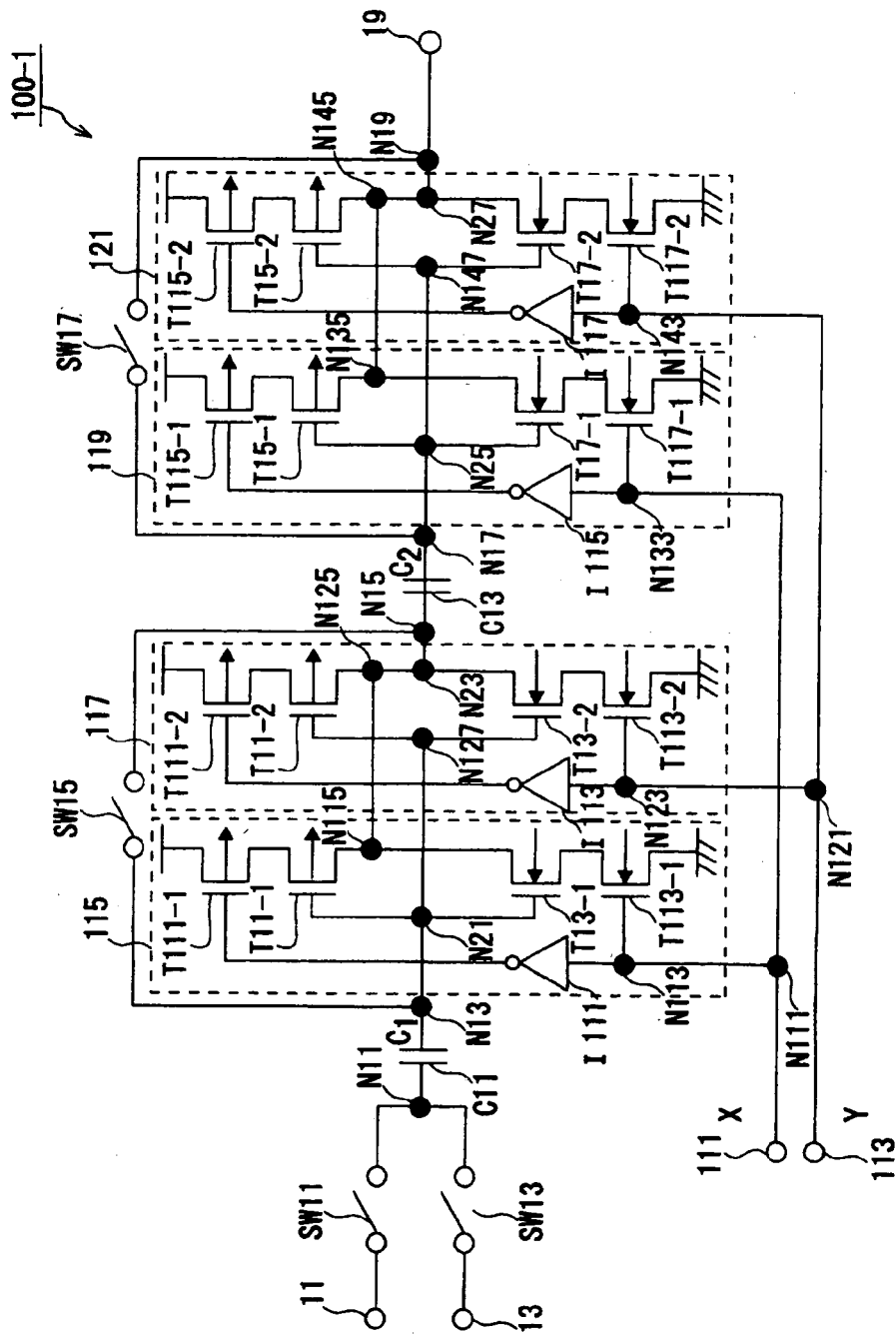

FIG. 1-1 shows a configuration of a first embodiment of a chopper comparator circuit according to the invention, and FIG. 1-2 shows the configuration thereof in more detail.

With a chopper comparator circuit 100-1 according to the first embodiment of the invention, a plurality of inverters controlled by a gate, respectively, (hereinafter referred to as gated inverters) are substituted for the first and second CMOS inverters 15, 17, serving as first and second inverter circuitries, respectively, of the conventional chopper comparator circuit 10. FIG. 1-1 shows an example where two units of the gated inverters (that is, first and second gated inverters 115, 117) are substituted for the first CMOS inverter 15, and two units of the gated inverters (that is, third and fourth gated inverters 119, 121) are substituted for the second CMOS inverter 17. The first gated inverter 115 and the second gated inverter 117 are disposed in parallel and are connected to separate control power supply lines at voltage levels differing from each other. Similarly, the third gated inverter 119 and the fourth gated inverter 121 also are disposed in parallel and are connected to the separate control power supply lines at the voltage levels differing from each other. The configuration of the chopper comparator circuit 100-1 is described in detail hereinafter.

As shown in FIG. 1-2, the chopper comparator circuit 100-1 has an input terminal 11 as a first input terminal for receiving an analog input voltage $V_{in}$, an input terminal 13 as a second input terminal for receiving a reference voltage $V_{ref}$, an input terminal 111 connected to a first control power supply line whose voltage level is at X, and an input terminal 113 connected to a second control power supply line whose voltage level is at Y. The input terminal 11 is connected to a node N11 via a first switch SW11 made up of an analog switch. Further, the input terminal 13 is connected to the node N11 via a second switch SW13 made up of an analog switch. A first capacitor C11 extends between the node N11 and a node N13. The node N13 is connected to a node N15 via a first inverter circuitry (that is, the first and second gated inverters 115, 117), and also via a third switch SW15 made up of an analog switch. A second capacitor C13 extends between the node N15 and a node N17. The node N17 is connected to a node N19 via a second inverter circuitry (that is, the third and fourth gated inverters 119, 121), and also via a fourth switch SW17 made up of an analog switch. The node N19 is connected to an output terminal 19 for outputting an output voltage $V_{out}$.

Now, the first through fourth gated inverters 115, 117, 119. 121 each have the following configuration.

More specifically, the first through fourth gated inverters 115, 117, 119. 121 each comprise a first logic circuit transistor of a first conductivity type, a first current control transistor of the first conductivity type, a second logic circuit transistor of a second conductivity type, and a second current control transistor of the second conductivity type. The first logic circuit transistor and the second logic circuit transistor are connected in series. The first logic circuit transistor has a main electrode connected to a first power supply line (in this case, the plus side of a power source $V_{dd}$,) via the first current control transistor, and the second logic circuit transistor has a main electrode connected to a second power supply line (in this case, the ground,) via the second current control transistor.

Now, description is given herein on the assumption that a transistor of the first conductivity type is a PMOS transistor and a transistor of the second conductivity type is an NMOS transistor. Further, description is given hereinafter on the assumption that the first logic circuit transistor of the first conductivity type is a first PMOS transistor, the first current control transistor of the first conductivity type is a second PMOS transistor, the second logic circuit transistor of the second conductivity type is a first NMOS transistor, and the second current control transistor of the second conductivity type is a second NMOS transistor. Further, description is given herein by referring to the first power supply line as the plus side of the power source $V_{dd}$ and referring to the second power supply line as the ground.

The first PMOS transistor is a transistor to be joined with the first NMOS transistor for making up an inverter circuit, and has a gate connected to a gate of the first NMOS transistor while connected to a constituent disposed in a preceding stage. Further, the first PMOS transistor has a source connected to a drain of the second PMOS transistor, and a drain connected to a drain of the first NMOS transistor while connected to a constituent disposed in a subsequent stage.

The second PMOS transistor is a current control transistor for the first PMOS transistor, and has a gate connected to a gate of the second NMOS transistor while connected to a corresponding control gate among a plurality of control gates. Further, the second PMOS transistor has a source connected to a first electrode, and the drain connected to the source of the first PMOS transistor.

The first NMOS transistor is a transistor to be joined with the first PMOS transistor for making up the inverter circuit, and has the gate connected to the gate of the first PMOS transistor while connected to the constituent disposed in the preceding stage. Further, the first NMOS transistor has a source connected to a drain of the second NMOS transistor and the drain connected to the drain of the first PMOS transistor while connected to the constituent disposed in the subsequent stage.

The second NMOS transistor is a current control transistor for the first NMOS transistor, and has the gate connected to the gate of the second PMOS transistor while connected to a corresponding control gate among the plurality of the control gates. Further, the second NMOS transistor has a source connected to a second electrode, and the drain connected to the source of the first NMOS transistor.

The respective gates of the second PMOS transistor and the second NMOS transistor, within the same gated inverter, are connected to the control power supply line at the same voltage level. More specifically, the respective gates of the second PMOS transistor and the second NMOS transistor, within the first through fourth gated inverters 115, 117, 119.

121, respectively, are connected to the control power supply line at the same voltage level.

Further, the respective gated inverter within the same inverter circuitry are connected to the control power supply lines at the voltage levels differing from each other, respectively. More specifically, the first gated inverter 115 and the second gated inverter 117 are connected to the control power supply lines at the voltage levels differing from each other, respectively. Further, the third gated inverter 119 and the fourth gated inverter 121 are connected to the control power supply lines at the voltage levels differing from each other, respectively. Since the respective gated inverters within the respective inverter circuitries are disposed in parallel, the first gated inverter 115 and the third gated inverter 119 are preferably connected to the control power supply line at the same voltage level. In this case, it is assumed that the first gated inverter 115 and the third gated inverter 119 are connected to the control power supply line at the voltage level at X. Further, the second gated inverter 117 and the fourth gated inverter 121 also are preferably connected to the control power supply line (provided that the voltage level thereof differs from that of the control power supply line connected to the first gated inverter 115 and the third gated inverter 119) at the same voltage level. In this case, it is assumed that the second gated inverter 117 and the fourth gated inverter 121 are connected to the control power supply line at the voltage level Y.

The respective configurations of the first through fourth gated inverters 115, 117, 119. 121 are described in detail hereinafter.

The first gated inverter 115 comprises two units of the PMOS transistors (that is, the first and second PMOS transistors T11-1, T111-1) and two units of the NMOS transistors (that is, the first and second NMOS transistors T13-1, T113-1).

The first PMOS transistor T11-1 has the gate connected to the gate of the first NMOS transistor T13-1 via a node N21. Further, the gate of the first PMOS transistor T11-1 is connected to a first capacitor C11 that is the constituent disposed in the preceding stage via the nodes N21, N13, and is further connected to the gate of the first PMOS transistor T11-2 and the gate of the first NMOS transistor T13-2, within the second gated inverter 117 that is the constituent disposed in the subsequent stage via the node N21 and a node N127.

The source of the first PMOS transistor T11-1 is connected to the drain of the second PMOS transistor T111-1.

The drain of the first PMOS transistor T11-1 is connected to the drain of the first NMOS transistor T13-1 via a node N115, and is further connected to the drain of the first PMOS transistor T11-2 and the drain of the first NMOS transistor T13-2, within the second gated inverter 117, via the node N115, and a node N125.

The second PMOS transistor T111-1 has the gate connected to the gate of the second NMOS transistor T113-1 via an inverter I111, and a node N113. Further, the gate of the second PMOS transistor T111-1 is connected to the input terminal 111 for the first control power supply line via the inverter I111, the nodes N113, N111.

The source of the second PMOS transistor T111-1 is connected to the plus side of the power source $V_{dd}$ as the first power supply line.

The drain of the second PMOS transistor T111-1 is connected to the source of the first PMOS transistor T11-1.

The gate of the first NMOS transistor T13-1 is connected to the gate of the first PMOS transistor T11-1 via the node N21. Further, the gate of the first NMOS transistor T13-1 is connected to the first capacitor C11 that is the constituent disposed in the preceding stage via the nodes N21, N13, and is further connected to the gate of the first PMOS transistor T11-2 and the gate of the first NMOS transistor T13-2, within the second gated inverter 117 that is a constituent disposed in a subsequent stage via the nodes N21, N127.

The source of the first NMOS transistor T13-1 is connected to the drain of the second NMOS transistor T113-1.

The drain of the first NMOS transistor T13-1 is connected to the drain of the first PMOS transistor T11-1 via the node N115, and is further connected to the drain of the first PMOS transistor T11-2 and the drain of the first NMOS transistor T13-2, within the second gated inverter 117, via the nodes N115, N125.

The second NMOS transistor T113-1 has the gate connected to the gate of the second PMOS transistor T111-1 via the node N113 and the inverter I111. Further, the gate of the second NMOS transistor T113-1 is connected to the input terminal 111 for the first control power supply line via the nodes N113, N111. The source of the second NMOS transistor T113-1 is connected to the ground as the second power supply line.

The drain of the second NMOS transistor T113-1 is connected to the source of the first NMOS transistor T13-1.

The second gated inverter 117 comprises two units of the PMOS transistors (that is, the first and second PMOS transistors T11-2, T111-2) and two units of the NMOS transistors (that is, the first and second NMOS transistors T13-2, T113-2).

The first PMOS transistor T11-2 has the gate connected to the gate of the first NMOS transistor T13-2 via the node N127. Further, the gate of the first PMOS transistor T11-2 is connected to the first capacitor C11 via the nodes N127, N21, N13, and is further connected to the gate of the first PMOS transistor T11-1 and the gate of the first NMOS transistor T13-1, within the first gated inverter 115 that is a constituent disposed in the preceding stage via the nodes N127, N21.

The source of the first PMOS transistor T11-2 is connected to the drain of the second PMOS transistor T111-2.

The drain of the first PMOS transistor T11-2 is connected to the drain of the first NMOS transistor T13-2 via the nodes N125, N23 and is further connected to the drain of the first PMOS transistor T11-1 and the drain of the first NMOS transistor T13-1, within the first gated inverter 115, via the nodes N125, N115. Further, the drain of the first PMOS transistor T11-2 is connected to the second capacitor C13 that is a constituent disposed in the subsequent stage via the nodes N125, N23, and N15.

The second PMOS transistor T111-2 has the gate connected to the gate of the second NMOS transistor T113-2 via an inverter I113, and a node N123. Further, the gate of the second PMOS transistor T111-2 is connected to the input terminal 113 for the second control power supply line via the inverter I113, the nodes N123, N121.

The source of the second PMOS transistor T111-2 is connected to the plus side of the power source $V_{dd}$ as the first power supply line.

The drain of the second PMOS transistor T111-2 is connected to the source of the first PMOS transistor T11-2.

The gate of the first NMOS transistor T13-2 is connected to the gate of the first PMOS transistor T11-2 via the node N127, and is further connected to the first capacitor C11 via the nodes N127, N21, and N13. Further, the gate of the first NMOS transistor T13-2 is connected to the gate of the first PMOS transistor T11-1 and the gate of the first NMOS transistor T13-1, within the first gated inverter 115 that is the constituent disposed in the preceding stage, via the nodes N127, N21.

The source of the first NMOS transistor T13-2 is connected to the drain of the second NMOS transistor T113-2.

The drain of the first NMOS transistor T13-2 is connected to the drain of the first PMOS transistor T11-2 via the nodes N23, N125, and is further connected to the drain of the first PMOS transistor T11-1 and the drain of the first NMOS transistor T13-1, within the first gated inverter 115, via the nodes N23, N125, and N115. Further, the drain of the first NMOS transistor T13-2 is connected to the second capacitor C13 that is the constituent disposed in the subsequent stage via the nodes N23, N15.

The second NMOS transistor T113-2 has the gate connected to the gate of the second PMOS transistor T111-2 via the node N123 and the inverter I113. Further, the gate of the second NMOS transistor T113-2 is connected to the input terminal 113 for the second control power supply line via the nodes N123, N121.

The source of the second NMOS transistor T113-2 is connected to the ground as the second power supply line.

The drain of the second NMOS transistor T113-2 is connected to the source of the first NMOS transistor T13-2.

The third gated inverter 119 comprises two units of the PMOS transistors (that is, first and second PMOS transistors T15-1, T115-1) and two units of the NMOS transistors (that is, first and second NMOS transistors T17-1, T117-1).

The first PMOS transistor T15-1 has the gate connected to the gate of the first NMOS transistor T17-1 via a node N25. Further, the gate of the first PMOS transistor T15-1 is connected to the second capacitor C13 that is the constituent disposed in a preceding stage via the nodes N25, N17, and is further connected to the gate of the first PMOS transistor T15-2 and the gate of the first NMOS transistor T17-2, within the fourth gated inverter 121 that is a constituent disposed in a subsequent stage via the node N25, and a node N147.

The first PMOS transistor T15-1 has the source connected to the drain of the second PMOS transistor T115-1.

The first PMOS transistor T15-1 has the drain connected to the drain of the first NMOS transistor T17-1 via a node N135, and the drain of the first PMOS transistor T15-1 is further connected to the drain of the first PMOS transistor T15-2 and the drain of the first NMOS transistor T17-2, within the fourth gated inverter 121, via the nodes N135, N145.

The second PMOS transistor T115-1 has the gate connected to the gate of the second NMOS transistor T117-1 via an inverter I115, and a node N133. Further, the gate of the second PMOS transistor T115-1 is connected to the input terminal 111 for the first control power supply line via the inverter I115, and the nodes N133, N111.

The second PMOS transistor T115-1 has the source connected to the plus side of the power source $V_{dd}$ as the first power supply line.

The second PMOS transistor T115-1 has the drain connected to the source of the first PMOS transistor T15-1.

The gate of the first NMOS transistor T17-1 is connected to the gate of the first PMOS transistor T15-1 via the node N25. Further, the gate of the first NMOS transistor T17-1 is connected to the second capacitor C13 that is the constituent disposed in the preceding stage via the nodes N25, N17, and is further connected to the gate of the first PMOS transistor T15-2 and the gate of the first NMOS transistor T17-2, within the fourth gated inverter 121 that is a constituent disposed in a subsequent stage via the nodes N25, N147.

The first NMOS transistor T17-1 has the source connected to the drain of the second NMOS transistor T117-1.

The drain of the first NMOS transistor T17-1 is connected to the drain of the first PMOS transistor T15-1 via the node N135, and is further connected to the drain of the first PMOS transistor T15-2 and the drain of the first NMOS transistor T17-2, within the fourth gated inverter 121, via the nodes N135, N145.

The second NMOS transistor T117-1 has the gate connected to the gate of the second PMOS transistor T115-1 via the node N133 and the inverter I115. Further, the gate of the second NMOS transistor T117-1 is connected to the input terminal 111 for the first control power supply line via the nodes N133, N111.

The second NMOS transistor T117-1 has the source connected to the ground as the second power supply line.

The drain of the second NMOS transistor T117-1 is connected to the source of the first NMOS transistor T17-1.

The fourth gated inverter 121 comprises two units of the PMOS transistors (that is, first and PMOS transistors T15-2, T115-2) and two units of the NMOS transistors (that is, first and second NMOS transistors T17-2, T117-2).

The first PMOS transistor T15-2 has the gate connected to the gate of the first NMOS transistor T17-2 via the node N147. Further, the gate of the first PMOS transistor T15-2 is connected to the second capacitor C13 via the nodes N147, N25, N17, and is further connected to the gate of the first PMOS transistor T15-1 and the gate of the first NMOS transistor T17-1, within the third gated inverter 119 that is a constituent disposed in a preceding stage via the nodes N147, N25.

The first PMOS transistor T15-2 has the source connected to the drain of the second PMOS transistor T115-2.

The first PMOS transistor T15-2 has the drain connected to the drain of the first NMOS transistor T17-2 via the node N145, and a node N27, and is further connected to the drain of the first PMOS transistor T15-1 and the drain of the first NMOS transistor T17-1, within the third gated inverter 119, via the nodes N145, N135. Further, the drain of the first PMOS transistor T15-2 is connected to the output terminal 19 that is a constituent disposed in a subsequent stage via the nodes N145, N27, N19.

The second PMOS transistor T115-2 has the gate connected to the gate of the second NMOS transistor T117-2 via an inverter I117, and a node N143. Further, the gate of the second PMOS transistor T115-1 is connected to the input terminal 113 for the second control power supply line via the inverter I117, the nodes N143, N121.

The second PMOS transistor T115-2 has the source connected to the plus side of the power source $V_{dd}$ as the first power supply line.

The second PMOS transistor T115-2 has the drain connected to the source of the first PMOS transistor T15-2.

The gate of the first NMOS transistor T17-2 is connected to the gate of the first PMOS transistor T15-2 via the node N147, and is further connected to the second capacitor C13 via the nodes N147, N25, and N17. Further, the gate of the first NMOS transistor T17-2 is connected to the gate of the first PMOS transistor T15-1 and the gate of the first NMOS transistor T17-1, within the third gated inverter 119 that is the constituent disposed in the preceding stage via the nodes N147, N25.

The first NMOS transistor T17-2 has the source connected to the drain of the second NMOS transistor T117-2.

The drain of the first NMOS transistor T17-2 is connected to the drain of the first PMOS transistor T15-2 via the nodes N27, N145, and is further connected to the drain of the first PMOS transistor T15-1 and the drain of the first NMOS transistor T17-1, within the third gated inverter 119, via the nodes N27, N145, and N135. Further, the drain of the first NMOS transistor T17-2 is connected to the output terminal 19 that is the constituent disposed in the subsequent stage via the nodes N27, N19.

The gate of the second NMOS transistor T117-2 is connected to the gate of the second PMOS transistor T115-2 via the node N143 and the inverter I117. Further, the gate of the second NMOS transistor T117-2 is connected to the input terminal 113 for the second control power supply line via the nodes N143, N121.

The second NMOS transistor T117-2 has the source connected to the ground as the second power supply line.

The drain of the second NMOS transistor T117-2 is connected to the source of the first NMOS transistor T17-2.

Now, assuming that the first gated inverter 115 has a gain of $g_1$, the second gated inverter 117 has a gain of $g_2$, the third gated inverter 119 has a gain of $g_3$, and the fourth gated inverter 121 has a gain of $g_4$, a gated inverter formed by combining the first gated inverter 115 with the second gated inverter 117 will have an output voltage at $(g_1X+g_2Y)$. Further, a gated inverter formed by combining the third gated inverter 119 with the fourth gated inverter 121 will have an output voltage at $(g_3X+g_4Y)$. Accordingly, the chopper comparator circuit 100-1 will have an output voltage at $(g_1X+g_2Y)\times(g_3X+g_4Y)$.

Herein, an assumption is made that the respective gains of the first through fourth gated inverters 115, 117, 119, 121 are set to fixed values such as, for example, $g_2=g_4=1$, and $g_1=g_3=2$.

In such a case, the chopper comparator circuit 100-1 operates as shown in FIGS. 1-3(a) through 1-3(d). FIGS. 1-3(a) through 1-3(d) are operational diagrams showing the operation of the circuit according to the first embodiment of the invention. More specifically, when X=Y=0, the gain of the chopper comparator circuit 100-1 is 0 {refer to FIG. 1-3(a)}, in which case, the chopper comparator circuit 100-1 does not operate. When X=1, and Y=0, the gain of the chopper comparator circuit 100-1 is $g_1g_3$ {refer to FIG. 1-3(b)}. Further, when X=0, and Y=1, the gain of the chopper comparator circuit 100-1 is $g_2g_4$ {refer to FIG. 1-3(c)}. Then, when X=1, and Y=1, the gain of the chopper comparator circuit 100-1 is $g_1g_3+g_1g_4+g_2g_3+g_2g_4$ {refer to FIG. 1-3(d)}. Thus, with the chopper comparator circuit 100-1 according to the first embodiment, the gain can be varied in three stages by varying combination of X and Y, inputted to the input terminal 111 and input terminal 113, respectively, as shown in FIG. 1-4. FIG. 1-4 shows Table indicating the operation of the circuit according to the first embodiment.

Once the gains are decided upon, the chopper comparator circuit 100-1 operates in the same way as the conventional circuit previously described. While there has been described the configuration wherein the gain of the circuit is varied in there stages, it becomes possible to vary the gain in more stages (that is, more finely) by increasing the number of the gated inverters within the respective inverter circuitries.

As described hereinbefore, since the chopper comparator circuit 100-1 according to the first embodiment is capable of varying the gain of the circuit in multi-stages, it becomes possible to use the same as appropriate depending on applications by executing high-speed comparison operation by increasing the gain thereof when high resolving power is required, and by cutting down on power consumption by decreasing the gain thereof when high resolving power is not required.

Second Embodiment

A second embodiment of a chopper comparator circuit according to the invention is the circuit according to the first embodiment as varied such that a plurality of control signals are provided on the source side thereof and the inverters have one input. More specifically, the chopper comparator circuit according to the second embodiment of the invention has a configuration wherein a third current control transistor of the first conductivity type and a fourth current control transistor of the second conductivity type are added to the circuit according to the first embodiment, a first logic circuit transistor has a main electrode connected to a first power supply line via a first current control transistor, and also via the third current control transistor, and a second logic circuit transistor has a main electrode connected to a second power supply line via a second current control transistor, and also via the fourth current control transistor.

Figures 1, 2, 3, 3A, 3B, 3C, 3D:
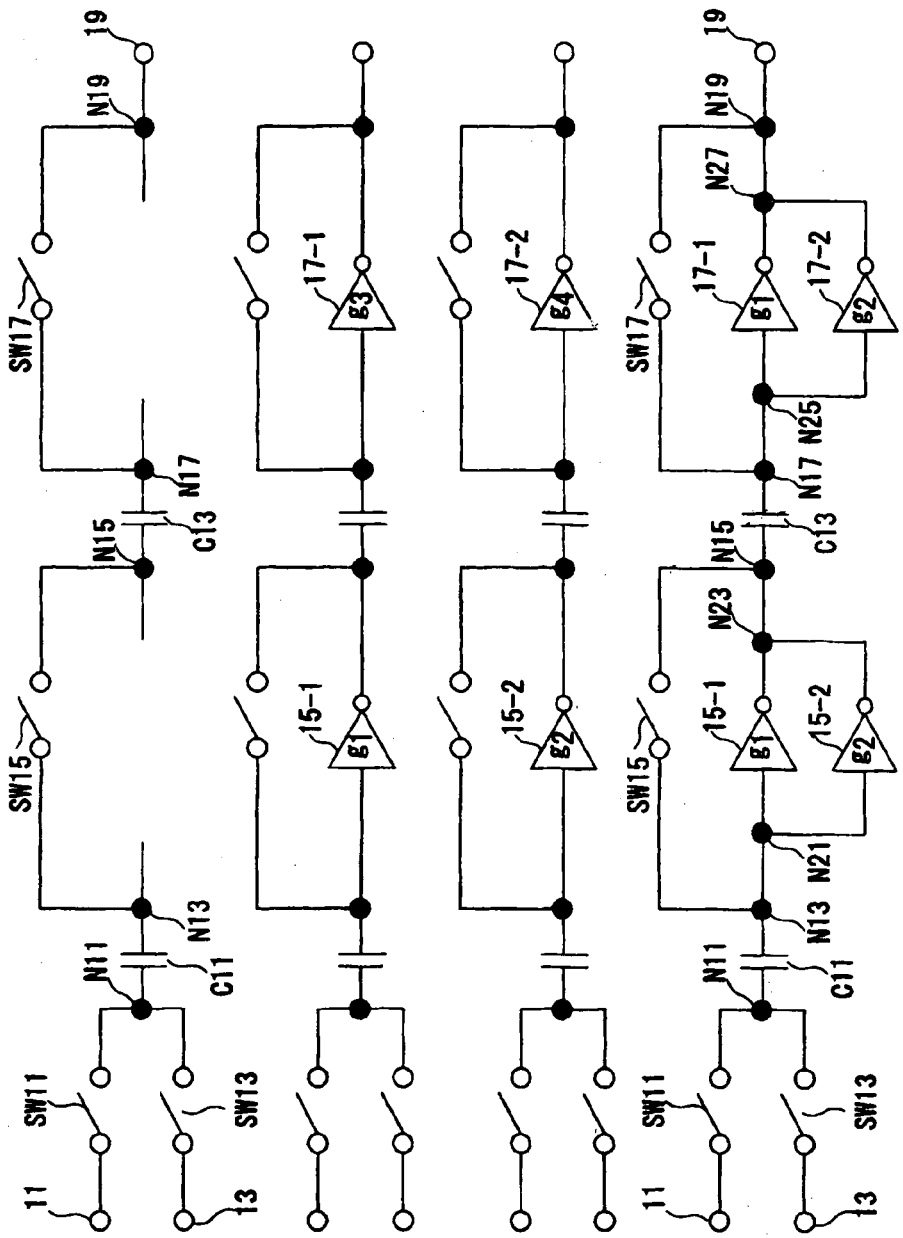

FIG. 3 shows the configuration of the chopper comparator circuit according to the second embodiment. Incidentally, description is given herein on the assumption that a transistor of the first conductivity type is a PMOS transistor and a transistor of the second conductivity type is an NMOS transistor. Further, description is given hereinafter on the assumption that the first logic circuit transistor of the first conductivity type is a first PMOS transistor, the first current control transistor of the first conductivity type is a second PMOS transistor, the second logic circuit transistor of the second conductivity type is a first NMOS transistor, and the second current control transistor of the second conductivity type is a second NMOS transistor. Further, description is given hereinafter by referring to the first power supply line as the plus side of the power source $V_{dd}$ and referring to the second power supply line as the ground. Furthermore, description is given hereinafter on the assumption that the third current control transistor of the first conductivity type is a third PMOS transistor, and the fourth current control transistor of the second conductivity type is a third NMOS transistor.

As shown in FIG. 3, with the chopper comparator circuit 100-2 according to the second embodiment, the first PMOS transistor T11-1 of the first gated inverter 115 according to the first embodiment is integrated with the first PMOS transistor T11-2 of the second gated inverter 117 according to the first embodiment. Further, the first NMOS transistor T13-1 of the first gated inverter 115 is integrated with the first NMOS transistor T13-2 of the second gated inverter 117. Similarly, the first PMOS transistor T15-1 of the third gated inverter 119 is integrated with the first PMOS transistor T15-2 of the fourth gated inverter 121. Furthermore, the first NMOS transistor T17-1 of the third gated inverter 119 is integrated with the first NMOS transistor T17-2 of the fourth gated inverter 121.

A first gated inverter 211 is connected to a plurality of control power supply lines at different voltage levels. Similarly, a second gated inverter 221 is connected to a plurality of control power supply lines at different voltage levels. The first gated inverter 211 as well as the second gated inverter 221 has a like configuration, and like constituents are preferably connected to the same control power supply lines.

The respective configurations of the first gated inverter 211 and the second gated inverter 221 are described in detail hereinafter.

The first gated inverter 211 comprises three units of the PMOS transistors (that is, the first through third PMOS transistors T11, T111-1, T111-2), and three units of the NMOS transistors (that is, the first through third NMOS transistors T13, T113-1, T113-2). Among those transistors, the second PMOS transistor T111-1, and the third PMOS transistor T111-2 are connected in parallel. Further, the second NMOS transistor T113-1, and the third NMOS transistor T113-2 also are connected in parallel.

The first PMOS transistor T11 has a gate connected to a gate of the first NMOS transistor T13 via a node N21. Further, the gate of the first PMOS transistor T11 is connected to a first capacitor C11 that is a constituent disposed in a preceding stage via the node N21 and a node N13.

The first PMOS transistor T11 has a source connected to a drain of the second PMOS transistor T111-1 and to a drain of the third PMOS transistor T111-2 via a node N211.

The first PMOS transistor T11 has a drain connected to a drain of the first NMOS transistor T13 via a node N23. Further, the drain of the first PMOS transistor T11 is connected to a second capacitor C13 that is a constituent disposed in a subsequent stage via the node N23 and a node N15.

The second PMOS transistor T111-1 has a gate connected to a gate of the second NMOS transistor T113-1 via an inverter I111 and a node N113. Further, the gate of the second PMOS transistor T111-1 is connected to an input terminal 111 for a first control power supply line via the inverter I111, the node N113, and a node N111.

The second PMOS transistor T111-1 has a source connected to the plus side of the power source $V_{dd}$ as the first power supply line.

The drain of the second PMOS transistor T111-1 is connected to the source of the first PMOS transistor T11 via the node N211.

The third PMOS transistor T111-2 has a gate connected to a gate of the third NMOS transistor T113-2 via an inverter I113 and a node N119. Further, the gate of the third PMOS transistor T111-2 is connected to an input terminal 113 for a second control power supply line via the inverter I113, the node N119, and a node N117.

The third PMOS transistor T111-2 has a source connected to the plus side of the power source $V_{dd}$ as the first power supply line.

The drain of the third PMOS transistor T111-2 is connected to the source of the first PMOS transistor T11 via the node N211.

The gate of the first NMOS transistor T13 is connected to the gate of the first PMOS transistor T11 via the node N21, and is further connected to the first capacitor C11 that is the constituent disposed in the preceding stage via the nodes N21, N13.

The first NMOS transistor T13 has a source connected to a drain of the second NMOS transistor T113-1, and a drain of the third NMOS transistor T113-2, via a node N213.

The drain of the first NMOS transistor T13 is connected to the drain of the first PMOS transistor T11 via the node N23, and is further connected to the second capacitor C13 that is the constituent disposed in the subsequent stage via the nodes N23, N15.

The gate of the second NMOS transistor T113-1 is connected to the gate of the second PMOS transistor T111-1 via the node N113 and the inverter I111, and is further connected to the input terminal 111 for the first control power supply line via the nodes N113, N111.

The second NMOS transistor T113-1 has a source connected to the ground as the second power supply line.

The drain of the second NMOS transistor T113-1 is connected to the source of first NMOS transistor T13 via the node N213.

The gate of the third NMOS transistor T113-2 is connected to the gate of the third PMOS transistor T111-2 via the node N119 and the inverter I113. Further, the gate of the third NMOS transistor T113-2 is connected to the input terminal 113 for the second control power supply line via the nodes N119, N117.

The third NMOS transistor T113-2 has a source connected to the ground as the second power supply line.

The drain of the third NMOS transistor T113-2 is connected to the source of the first NMOS transistor T13 via the node N213.

The second gated inverter 221 comprises three units of the PMOS transistors (that is, the first through third PMOS transistors T15, T115-1, T115-2), and three units of the NMOS transistors (that is, the first through third NMOS transistors T17, T117-1, T117-2). Among those transistors, the second PMOS transistor T115-1, and the third PMOS transistor T115-2 are connected in parallel. Further, the second NMOS transistor T117-1, and the third NMOS transistor T117-2 also are connected in parallel.

The first PMOS transistor T15 has a gate connected to a gate of the first NMOS transistor T17 via a node N25. Further, the gate of the first PMOS transistor T15 is connected to the second capacitor C13 that is the constituent disposed in a preceding stage via the node N25 and a node N17.

The first PMOS transistor T15 has a source connected to a drain of the second PMOS transistor T115-1 and to a drain of the third PMOS transistor T115-2 via a node N215.

The first PMOS transistor T15 has a drain connected to a drain of the first NMOS transistor T17 via a node N27. Further, the drain of the first PMOS transistor T15 is connected to an output terminal 19 that is a constituent disposed in a subsequent stage via the node N27 and a node N19.

The second PMOS transistor T115-1 has a gate connected to a gate of the second NMOS transistor T117-1 via an inverter I115 and a node N125. Further, the gate of the second PMOS transistor T115-1 is connected to the input terminal 111 for the first control power supply line via the inverter I115, and the nodes N125, N111.

The second PMOS transistor T115-1 has a source connected to the plus side of the power source $V_{dd}$ as the first power supply line.

The drain of the second PMOS transistor T115-1 is connected to the source of the first PMOS transistor T15 via the node N215.

The third PMOS transistor T115-2 has a gate connected to a gate of the third NMOS transistor T117-2 via an inverter I117 and a node N127. Further, the gate of the third PMOS transistor T115-2 is connected to the input terminal 113 for the second control power supply line via the inverter I117, and the nodes N127, N117.

The third PMOS transistor T115-2 has a source connected to the plus side of the power source $V_{dd}$ as the first power supply line.

The drain of the third PMOS transistor T115-2 is connected to the source of the first PMOS transistor T15 via the node N215.

The gate of the first NMOS transistor T17 is connected to the gate of the first PMOS transistor T15 via the node N25, and is further connected to the second capacitor C13 that is the constituent disposed in the preceding stage via the nodes N25, N17.

The first NMOS transistor T17 has a source connected to a drain of the second NMOS transistor T117-1, and a drain of the third NMOS transistor T117-2 via a node N217.

The drain of the first NMOS transistor T17 is connected to the drain of the first PMOS transistor T15 via the node N27, and is further connected to the output terminal 19 that is the constituent disposed in the subsequent stage via the nodes N27, N19.

The gate of the second NMOS transistor T117-1 is connected to the gate of the second PMOS transistor T115-1 via the node N125 and the inverter I115, and is further connected to the input terminal 111 for the first control power supply line via the nodes N125, N111.

The second NMOS transistor T117-1 has a source connected to the ground as the second power supply line.

The drain of the second NMOS transistor T117-1 is connected to the source of first NMOS transistor T17 via the node N217.

The gate of the third NMOS transistor T117-2 is connected to the gate of the third PMOS transistor T115-2 via the node N127 and the inverter I117. Further, the gate of the third NMOS transistor T117-2 is connected to the input terminal 113 for the second control power supply line via the nodes N127, N117.

The third NMOS transistor T117-2 has a source connected to the ground as the second power supply line.

The drain of the third NMOS transistor T117-2 is connected to the source of the first NMOS transistor T17 via the node N217.

A ratio of a gate width to a gate length (namely, a W/L ratio) of the second PMOS transistor T111-1 as well as the second NMOS transistor T113-1 of the first gated inverter 211 is identical to a W/L ratio of the second PMOS transistor T115-1 as well as the second NMOS transistor T117-1 of the second gated inverter 221. Similarly, a W/L ratio of the third PMOS transistor T111-2 as well as the third NMOS transistor T113-2 of the first gated inverter 211 is identical to a W/L ratio of the third PMOS transistor T111-2 as well as the third NMOS transistor T113-2 of the first gated inverter 211 is identical to a W/L ratio of third PMOS transistor T115-2 as well as the third NMOS transistor T117-2 of the second gated inverter 221.

The chopper comparator circuit 100-2 according to the second embodiment, as described above, operates in the same way as the chopper comparator circuit 100-1 according to the first embodiment does. Accordingly, with the chopper comparator circuit 100-2, predetermined signals among control signals of four varieties of combinations {that is, (X, Y)=(0, 0), (0, 1), (1, 0), or (1, 1)} can be inputted to the input terminals 111, 113, respectively, thereby varying the gain of the circuit in three stages.

As described in the foregoing, since the chopper comparator circuit 100-2 according to the second embodiment is capable of varying the gain of the circuit in multi-stages, it becomes possible, as with the case of the first embodiment, to use the same as appropriate depending on applications by executing high-speed comparison operation by increasing the gain thereof when high resolving power is required, and by cutting down on power consumption by decreasing the gain thereof when high resolving power is not required. Moreover, with the chopper comparator circuit 100-2 according to the second embodiment, the number of the transistors involved is fewer than that for the first embodiment, so that the circuit can be reduced in size.

Third Embodiment

Because the conventional chopper comparator circuit 10 makes use of the CMOS inverters 15, and 17, susceptible to the effect of process variations, the circuit has been susceptible to the effect of process variations. Accordingly, third and fourth embodiments of the invention are intended to provide a chopper comparator circuit capable of precluding the effect of process variations while using the CMOS inverters susceptible to the effect of the process variations.

A chopper comparator circuit according to the third embodiment comprises gated inverters 311, 321, each having the following configuration. More specifically, the gated inverters 311, 321, each comprise a first logic circuit transistor of the first conductivity type, a first current control transistor of the first conductivity type, a second logic circuit transistor of the second conductivity type, and a second current control transistor of the second conductivity type. The first logic circuit transistor and the second logic circuit transistor are connected in series. The first logic circuit transistor has a main electrode connected to a first power supply line (in this case, the plus side of a power source $V_{dd}$) via the first current control transistor, and the second logic circuit transistor has a main electrode connected to a second power supply line (in this case, the ground,) via the second current control transistor. Further, the first current control transistor has a control electrode connected to a reference voltage output based on the threshold voltage of the first current control transistor while the second current control transistor has a control electrode connected to a reference voltage output based on the threshold voltage of the second current control transistor.

Figures 1, 2, 3, 4:
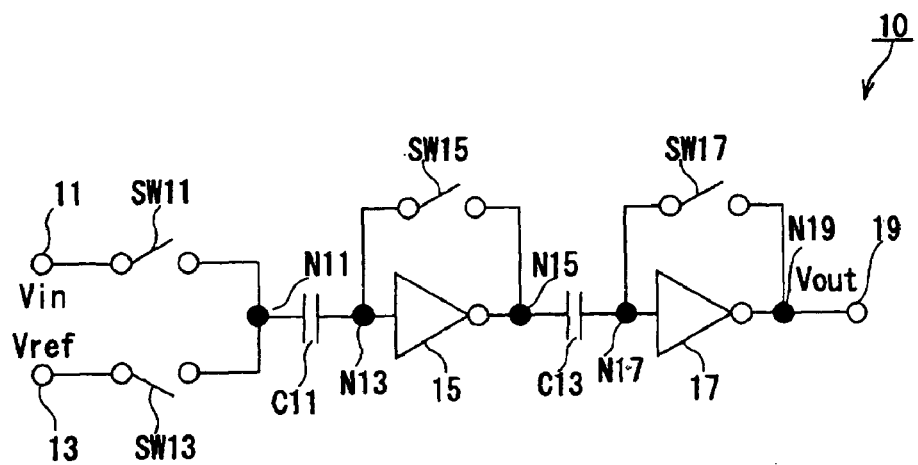
Figure 2:
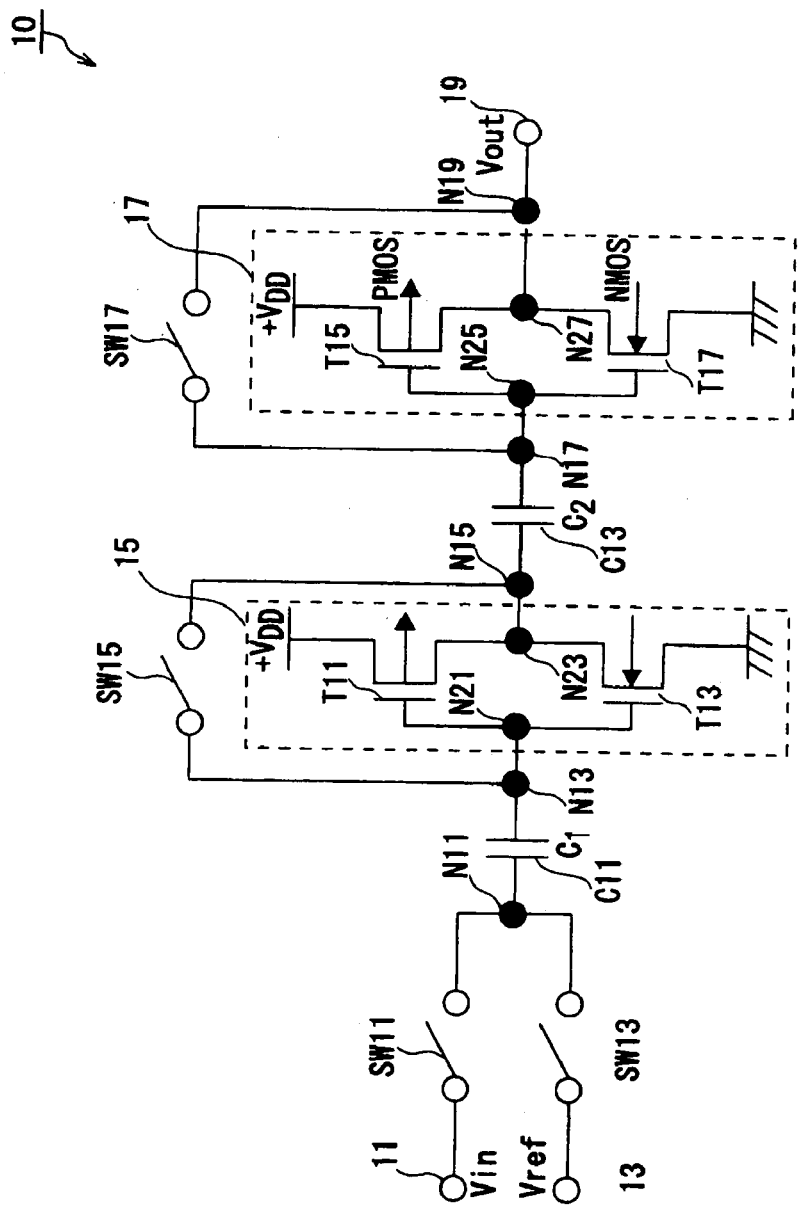
Figure 3:
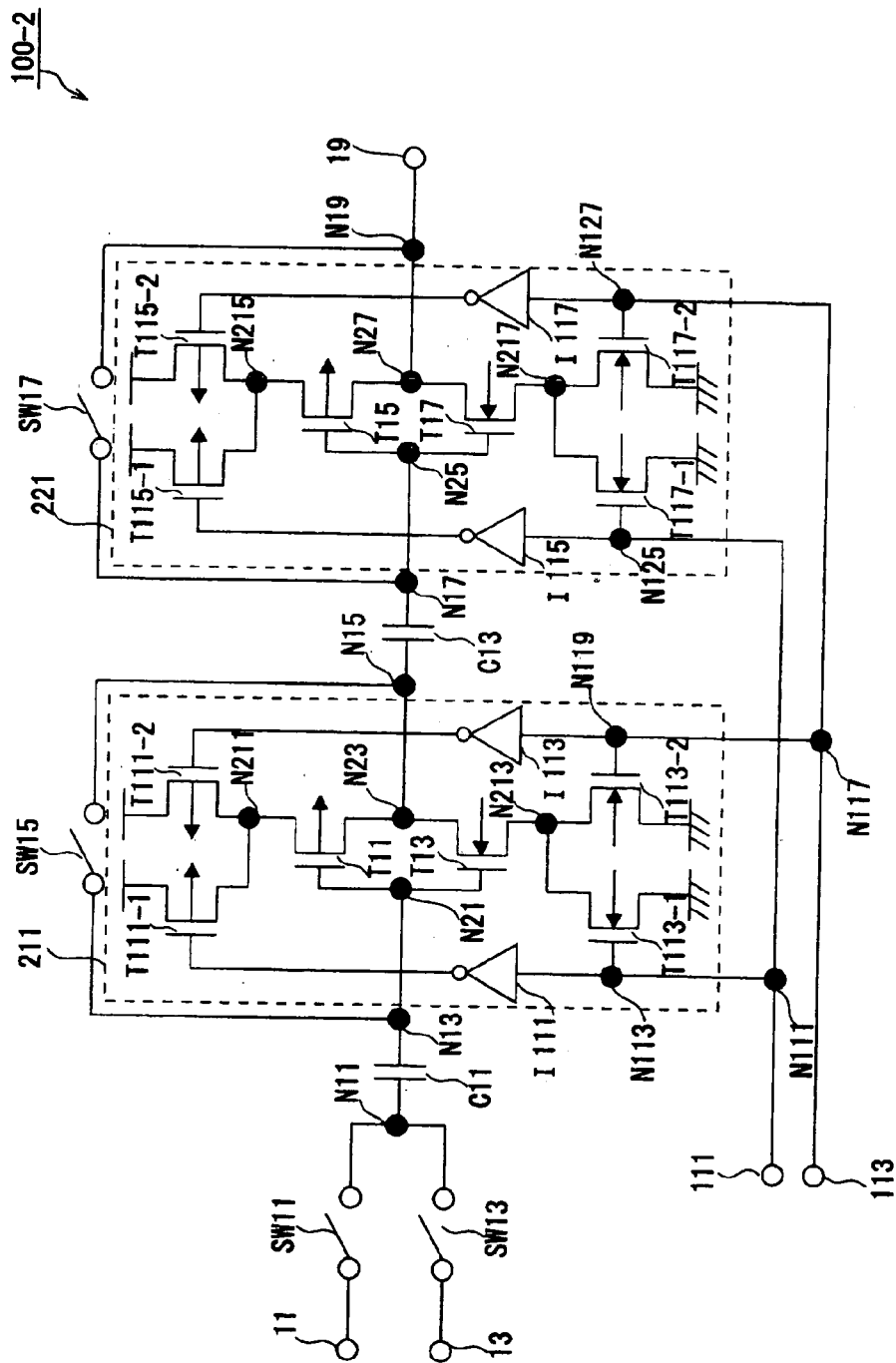
Figures 2, 4:
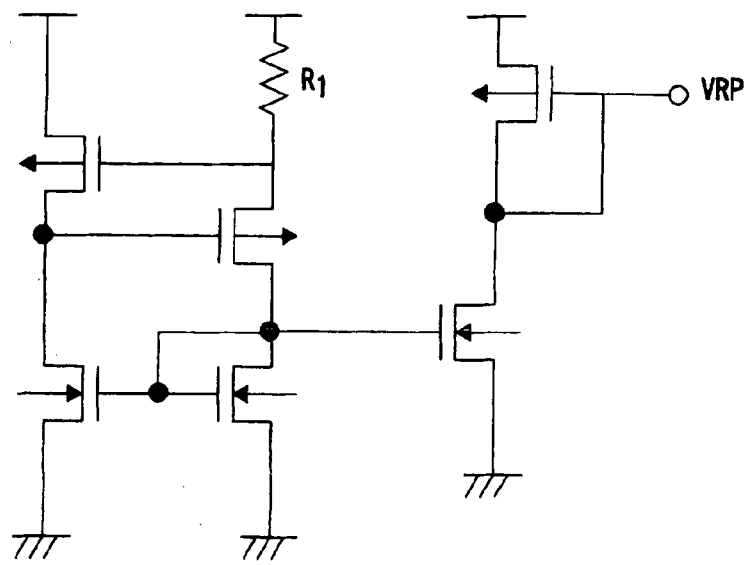
Figures 3, 4:
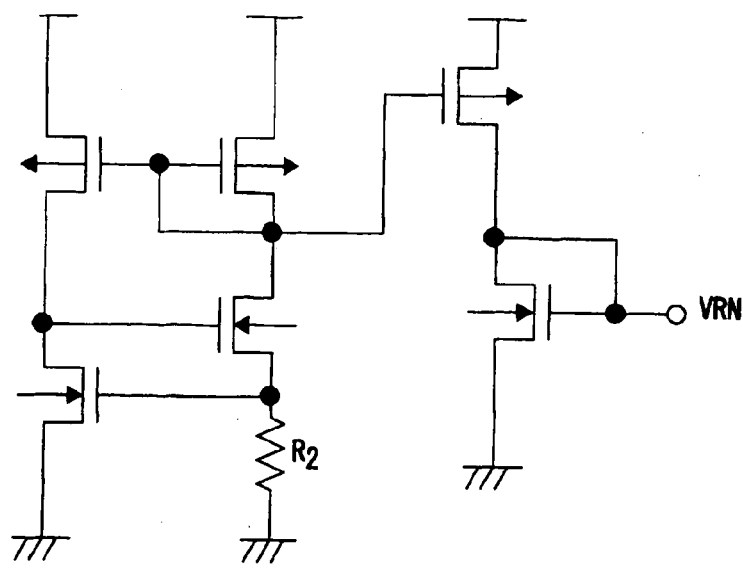

FIG. 4-1 shows the configuration of the third embodiment of the chopper comparator circuit according to the invention. Further, description is given herein on the assumption that a transistor of the first conductivity type is a PMOS transistor and a transistor of the second conductivity type is an NMOS transistor. Further, description is given hereinafter on the assumption that the first logic circuit transistor of the first conductivity type is a first PMOS transistor, the first current control transistor of the first conductivity type is a second PMOS transistor, the second logic circuit transistor of the second conductivity type is a first NMOS transistor, and the second current control transistor of the second conductivity type is a second NMOS transistor. Further, description is given herein by referring to the first power supply line as the plus side of the power source $V_{dd}$ and by referring to the second power supply line as the ground. Furthermore, description is given herein by referring to the reference voltage output based on the threshold voltage of the first current control transistor as VRP and by referring to the reference voltage output based on the threshold voltage of the second current control transistor as VRN.

As shown in FIG. 4-1, the chopper comparator circuit 100-3 according to the third embodiment is similar in configuration to the chopper comparator circuit 100-1 according to the first embodiment, however, the former differs from the latter in respect of the functions of the PMOS transistors and NMOS transistors, making up the respective gated inverters.

Since the second PMOS transistors T111, T115, as respective constituents of the first and second gated inverters 311, 321, each have a gate connected to a reference voltage circuit 301 for outputting the reference voltage output VRP via input terminals 313, 323, respectively, those PMOS transistors T111, T115 function as a current source, respectively. Similarly, since the second NMOS transistors T113, T117, as respective constituents of the first and second gated inverters 311, 321, each have a gate connected to a reference voltage circuit 302 for outputting the reference voltage output VRN via input terminals 315, 325, respectively, those NMOS transistors T113, T117 function as a current source, respectively.

FIG. 4-2 shows a configuration of the reference voltage circuit 301. Further, FIG. 4-3 shows a configuration of the reference voltage circuit 302. The reference voltage circuits 301, 302, shown in FIG. 4-2, FIG. 4-3, respectively, are common circuits for a reference voltage source, based on the threshold voltage value $V_{th}$ of the PMOS transistors T111, T115 or the NMOS transistors T113, T117, respectively. While the reference voltage circuit 301 has the configuration containing a resistor $R_1$ and the reference voltage circuit 302 has the configuration containing a resistor $R_2$, these represent a common configuration, omitting therefore description thereof.

The reference voltage output VRP outputted by the reference voltage circuit 301 turns high when $|V_{th}|$ of the PMOS transistors T111, T115, respectively, is low. In such a case, a gate to source voltage $V_{gs}$ of the PMOS transistors T111, T115, respectively, decreases, acting in such a way as to suppress flow of current.

Conversely, the reference voltage output VRP outputted by the reference voltage circuit 301 turns low when $|V_{th}|$ of the PMOS transistors T111, T115, respectively, is high. In such a case, the gate to source voltage $V_{gs}$ of the PMOS transistors T111, T115, respectively, increases, acting in such a way as to allow flow of more current. Hence, the PMOS transistors T111, T115 operate in such a way as to raise the capacity thereof.

Further, the reference voltage output VRN outputted by the reference voltage circuit 302 turns low when $|V_{th}|$ of the NMOS transistors T113, T117, respectively, is low. In such a case, the gate to source voltage $V_{gs}$ of the NMOS transistors T113, T117, respectively, decreases, acting in such a way as to suppress flow of current.

Conversely, the reference voltage output VRN outputted by the reference voltage circuit 302 turns high when $|V_{th}|$ of the NMOS transistors T113, T117, respectively, is high. In such a case, the gate to source voltage $V_{gs}$ of the NMOS transistors T113, T117, respectively, increases, acting in such a way as to allow flow of more current. Hence, the NMOS transistors T113, T117 operate in such a way as to raise the capacity thereof.

As described in the foregoing, the chopper comparator circuit 100-3 according to the third embodiment has the transistors T111, T113, T115, T117. Those transistors T111, T113, T115, T117 each have the gate connected to the reference voltage output VRP or VRN, thereby functioning as a reference current source, respectively. The reference current source is insusceptible to the effect of variations of the power source voltage $V_{dd}$. Hence, the chopper comparator circuit 100-3 according to the third embodiment can have an advantageous effect in that the same becomes insusceptible to the effect of variations in $V_{th}$ due to the process variations. Further, there can be obtained an advantageous effect in that the comparator circuit itself becomes insusceptible to the effect of variations in power source voltage. Furthermore, the comparator circuit can have an advantageous effect of raising the gain of the comparator circuit itself while holding down power consumption.

Fourth Embodiment

A fourth embodiment of a chopper comparator circuit according to the invention is equivalent to the chopper comparator circuit 100-3 according to the third embodiment except that connection is made such that a bulk potential of a first logic circuit transistor of the first conductivity type is rendered to be a source potential.

FIG. 5 shows a configuration of the chopper comparator circuit according to the fourth embodiment of the invention. Description is given herein on the assumption that a transistor of the first conductivity type is a PMOS transistor, and the first logic circuit transistor of the first conductivity type is a first PMOS transistor.

As shown in FIG. 5, the chopper comparator circuit 100-4 according to the fourth embodiment is similar in configuration to the chopper comparator circuit 100-3 according to the third embodiment, and similarly operates, but differs from the latter in that respective bulk potentials of the first PMOS transistors T11, T15, executing switching operation of respective inverter circuitries, are rendered to be respective source potentials 411, 413.

The first PMOS transistors T11, T15 each are capable of enhancing the capacity thereof by connecting the respective bulk potentials thereof to the respective source potentials 411, 413, thereby operating in such a way as to raise a gain of the comparator circuit.

As described above, the chopper comparator circuit 100-4 according to the fourth embodiment has an advantageous effect in that by connecting the respective bulk potentials of the PMOS transistors T11, T15, executing the switching operation of the respective inverter circuitries, to the respective source potentials 411, 413, the respective capacities of the PMOS transistors T11, and T15 are enhanced, thereby raising the gain of the comparator circuit. Moreover, with the fourth embodiment of the invention, there can be obtained the advantageous effect of raising the gain of the comparator circuit by simply altering connection without increasing the size of the respective transistors.

Fifth Embodiment

A fifth embodiment of a chopper comparator circuit according to the invention is equivalent to any of the chopper comparator circuits 100-1, 100-2, 100-3, and 100-4, according to the first to fourth embodiments, respectively, except that a first hysteresis-retaining transistor of the first conductivity type and a second hysteresis-retaining transistor of the second conductivity type are connected to an inverter circuitry in the final stage, thereby making up a Schmitt-trigger-inverter circuit having hysteresis characteristics in the inverter circuitry in the final stage.

Figure 6:
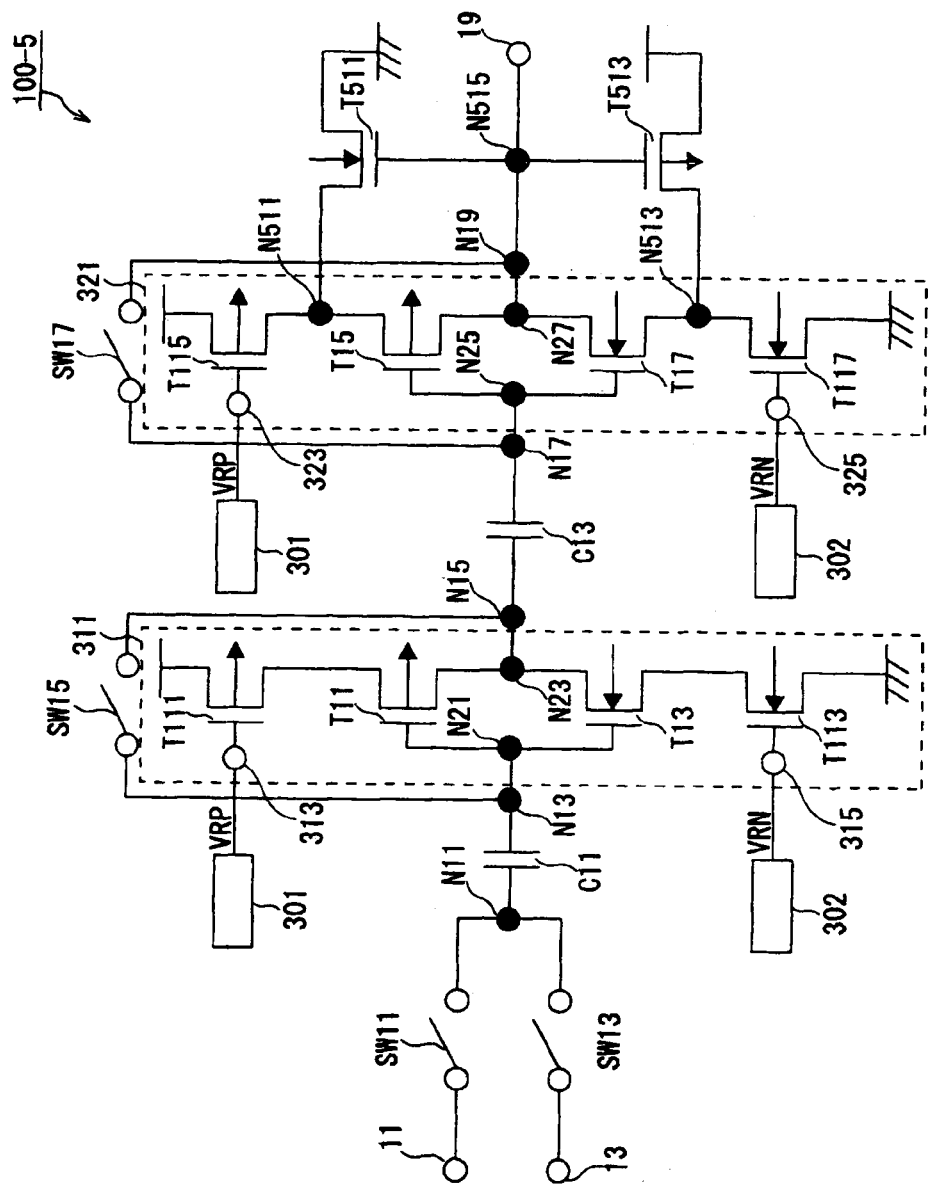
FIG. 6 is a circuit diagram showing a configuration of a fifth embodiment of a chopper comparator circuit according to the invention.

FIG. 6 shows a configuration of the chopper comparator circuit according to the fifth embodiment of the invention. Description is given herein on the assumption that a transistor of the first conductivity type is a PMOS transistor, and a transistor of the second conductivity type is an NMOS transistor. Further, description is given herein on the assumption that the first hysteresis-retaining transistor of the first conductivity type is a hysteresis-retaining PMOS transistor and the second hysteresis-retaining transistor of the second conductivity type is a hysteresis-retaining NMOS transistor.

As shown in FIG. 6, the chopper comparator circuits 100-5 according to the fifth embodiment is similar in configuration to the chopper comparator circuits 100-3, and 100-4, according to the third and fourth embodiments, respectively, and similarly operates, but differs from the latter in that the Schmitt-trigger-inverter circuit having hysteresis characteristics is made up by connecting the hysteresis-retaining PMOS transistor and the hysteresis-retaining NMOS transistor to the inverter circuitry in the final stage.

The inverter circuitry 321 in the final stage is connected to a drain of the hysteresis-retaining NMOS transistor T511 via a node N511 disposed between a source of a first PMOS transistor T15 and a drain of a second PMOS transistor T115.

The hysteresis-retaining NMOS transistor T511 has a gate connected to a gate of the hysteresis-retaining PMOS transistor T513 via a node 515 disposed between a node N19 and an output terminal 19. Further, the hysteresis-retaining NMOS transistor T511 has a source connected to the ground and the drain connected to the source of the first PMOS transistor T15, and also to the drain of the second PMOS transistor T115, within the inverter circuitry 321, via the node N511 in the inverter circuitry 321.

The gate of the hysteresis-retaining PMOS transistor T513 is connected to the gate of the hysteresis-retaining NMOS transistor T511 via the node 515 disposed between the node N19 and the output terminal 19. Further, the hysteresis-retaining PMOS transistor T513 has a source connected to the plus side of a power source $V_{dd}$ and a drain connected to a source of a first NMOS transistor T17, and also to a drain of a second MMOS transistor T117, within the inverter circuitry 321, via a node N513 in the inverter circuitry 321.

The inverter circuitry 321 in the final stage is connected to the drain of the hysteresis-retaining NMOS transistor T513 via the node N513 disposed between the source of the first NMOS transistor T17 and the drain of the second MMOS transistor T117.

As a result, with the chopper comparator circuits 100-5, the inverter circuitry 321 in the final stage functions as the Schmitt-trigger-inverter circuit having a hysteresis width.

The chopper comparator circuits 100-5 becomes insusceptible to fluctuations of signals of a minute amplitude as amplified by an inverter circuitry 311 in the initial stage, caused by a certain noise, because the inverter circuitry 321, in the final stage, functions as the Schmitt-trigger-inverter circuit having the hysteresis width.

As described above, with the chopper comparator circuits 100-5 according to the fifth embodiment, the inverter circuitry 321, in the final stage, can function as the Schmitt-trigger-inverter circuit having the hysteresis width by connecting the hysteresis-retaining NMOS transistor T511 and the hysteresis-retaining PMOS transistor T513 to the inverter circuitry 321 in the final stage. Hence, there can be obtained an advantageous effect in that malfunction due to noises can be reduced when dealing with signals of a minute amplitude.

It is to be understood that the scope of the invention is not limited to the above-described first through fifth embodiments, and various applications and changes may be made without departing from the spirit and scope of the invention.

With the first and second embodiments, respectively, there has been shown the comparator circuit made up by connecting two varieties of the gated inverters with each other, however, for example, N varieties of the gated inverters may be connected to each other by jointly using a decoder for optional N bits.

Further, with the first through fifth embodiments, respectively, there has been shown only the configuration of the comparator circuit, however, the invention is applicable to an ADC and a digital-to-analog converter (DAC), using any of those comparator circuits.

What is claimed is:

1. A chopper comparator circuit, comprising:
   a first input terminal for receiving an analog input signal;
   a second input terminal for receiving a reference voltage;
   a first switch for connecting the first input terminal to a switch node;
   a second switch for connecting the second input terminal to the switch node;
   a comparator circuit output terminal; and
   circuitry connected between the switch node and the comparator circuit output terminal for comparing the analog input signal and the reference voltage, the circuitry comprising a first stage having a first stage input node and a first stage output node, the first stage including a gated inverter that is coupled to the first stage input node, and a first capacitor coupled between the switch node and the first stage input node,
   wherein the gated inverter comprises a first logic circuit transistor of a first conductivity type and a second logic circuit transistor of a second conductivity type connected to the first logic circuit transistor at an intermediate connection node, the intermediate connection node being connected to the first stage output node, the first logic circuit transistor having a control electrode that is connected to the first stage input node and the second logic circuit transistor having a control electrode that is also connected to the first stage input node, the gated inverter additionally comprising a first current control transistor of the first conductivity type and a second current control transistor of the second conductivity type, the first current control transistor being connected to the first logic circuit transistor and the second current control transistor being connected to the second logic circuit transistor, the first current control transistor having a control electrode and the second current control transistor having a control electrode, the gated inverter further comprising an inverter connected between the control electrodes of the first and second current control transistors,
   wherein the first stage further includes another gated inverter that is coupled to the first stage input node, the another gated inverter comprising another first logic circuit transistor of the first conductivity type and another second logic circuit transistor of the second conductivity type connected to the another first logic circuit transistor at another intermediate connection node, the another intermediate connection node being connected to the first stage output node, the another first logic circuit transistor having a control electrode that is connected to the first stage input node and the another second logic circuit transistor having a control electrode that is also connected to the first stage input node, the another gated inverter additionally comprising another first current control transistor of the first conductivity type and another second current control transistor of the second conductivity type, the another first current control transistor being connected to the another first logic circuit transistor and the another second current control transistor being connected to the another second logic circuit transistor, the another first current control transistor having a control electrode and the another second current control transistor having a control electrode, the another gated inverter further comprising another inverter connected between the control electrodes of the another first current control transistors and the another second current control transistor, and
   wherein the chopper comparator circuit further comprises a first control power supply line that is connected to an input terminal of the inverter in the gated inverter and a second control power supply line that is connected to an input terminal of the another inverter in the another gated inverter, the first and second control power supply lines being maintained at different potentials.

2. The chopper comparator circuit of claim 1, further comprising a switch connected between the first stage input node and the first stage output node.

3. The chopper comparator circuit, of claim 1, wherein the circuitry further comprises a second stage having a second stage input node and a second stage output node, the second stage including an additional gated inverter that is coupled to the second stage input node, and a second capacitor connected between the first stage output node and the second stage input node.

4. The chopper comparator circuit of claim 3, wherein the additional gated inverter comprises an additional first logic circuit transistor of the first conductivity type and an additional second logic circuit transistor of the second conductivity type connected to the additional first logic circuit transistor at an additional intermediate connection node, the additional intermediate connection node being connected to the second stage output node, the additional first logic circuit transistor having a control electrode that is connected to the second stage input node and the second logic circuit transistor having a control electrode that is also connected to the second stage input node, the additional gated inverter also comprising an additional first current control transistor of the first conductivity type and an additional second current control transistor of the second conductivity type, the additional first current control transistor being connected to the additional first logic circuit transistor and the additional second current control transistor being connected to the additional second logic circuit transistor, the additional first current control transistor having a control electrode and the additional second current control transistor having a control electrode, the additional gated inverter further comprising an additional inverter connected between the control electrodes of the first and second additional current control transistors.

5. The chopper comparator circuit of claim 4, wherein the second stage also includes a further gated inverter that is coupled to the second stage input node, the further gated inverter comprising a further first logic circuit transistor of the first conductivity type and a further second logic circuit transistor of the second conductivity type connected to the further first logic circuit transistor at a further intermediate connection node, the further intermediate connection node being connected to the second stage output node, the further first logic circuit transistor having a control electrode that is connected to the second stage input node and the further second logic circuit transistor having a control electrode that is also connected to the second stage input node, the further gated inverter additionally comprising a further first current control transistor of the first conductivity type and a further second current control transistor of the second conductivity type, the further first current control transistor being connected to the further first logic circuit transistor and the further second current control transistor being connected to the further second logic circuit transistor, the further first current control transistor having a control electrode and the further second current control transistor having a control electrode, the further gated inverter additionally comprising a further inverter connected between the control electrodes of the further first current control transistors and the further second current control transistor.

6. The chopper comparator circuit of claim 5, further comprising a switch connected between the second stage input node and the second stage output node.

7. A chopper comparator circuit comprising:
a first input terminal for receiving an analog input signal;
a second input terminal for receiving a reference voltage;
a first switch for connecting the first input terminal to a switch node;
a second switch for connecting the second input terminal to the switch node;
a comparator circuit output terminal; and
circuitry connected between the switch node and the comparator circuit output terminal for comparing the analog input signal and the reference voltage, the circuitry comprising a first stage having a first stage input node and a first stage output node, the first stage including a gated inverter that is coupled to the first stage input node, and a first capacitor coupled between the switch node and the first stage input node,
wherein the gated inverter comprises a first logic circuit transistor of a first conductivity type and a second logic circuit transistor of a second conductivity type connected to the first logic circuit transistor at an intermediate connection node, the intermediate connection node being connected to the first stage output node, the first logic circuit transistor having a control electrode that is connected to the first stage input node and the second logic circuit transistor having a control electrode that is also connected to the first stage input node, the gated inverter additionally comprising a first current control transistor of the first conductivity type and a second current control transistor of the second conductivity type, the first current control, transistor being connected to the first logic circuit transistor and the second current control transistor being connected to the second logic circuit transistor, the first current control transistor having a control electrode and the second current control transistor having a control electrode, the gated inverter further comprising an inverter connected between the control electrodes of the first and second current control transistors,
wherein the circuitry further comprises a second stage having a second stage input node and a second stage output node, the second stage including an additional gated inverter that is coupled to the second stage input node, and a second capacitor connected between the first stage output node and the second stage input node,
wherein the additional gated inverter comprises an additional first logic circuit transistor of the first conductivity type and an additional second logic circuit transistor of the second conductivity type connected to the additional first logic circuit transistor at an additional intermediate connection node, the additional intermediate connection node being connected to the second stage output node, the additional first logic circuit transistor having a control electrode that is connected to the second stage input node and the second logic circuit transistor having a control electrode that is also connected to the second stage input node, the additional gated inverter also comprising an additional first current control transistor of the first conductivity type and an additional second current control transistor of the second conductivity type, the additional first current control transistor being connected to the additional first logic circuit transistor and the additional second current control transistor being connected to the additional second logic circuit transistor, the additional first current control transistor having a control electrode and the additional second current control transistor having a control electrode, the additional gated inverter further comprising an additional inverter connected between the control electrodes of the first and second additional current control transistors, wherein the second stage also includes a further gated inverter that is coupled to the second stage input node, the further gated inverter comprising a further first logic circuit transistor of the first conductivity type and a further second logic circuit transistor of the second conductivity type connected to the further first logic circuit transistor at a further intermediate connection node, the further intermediate connection node being connected to the second stage output node, the further first logic circuit transistor having a control electrode that is connected to the second stage input node and the further second logic circuit transistor having a control electrode that is also connected to the second stage input node, the further gated inverter additionally comprising a further first current control transistor of the first conductivity type and a further second current control transistor of the second conductivity type, the further first current control transistor being connected to the further first logic circuit transistor and the further second current control transistor being connected to the further second logic circuit transistor, the further first current control transistor having a control electrode and the further second current control transistor having a control electrode, the further gated inverter additionally comprising a further inverter connected between the control electrodes of the further first current control transistors and the further second current control transistor, and wherein the chopper comparator circuit further comprises a first control power supply line that is connected to an input terminal of the additional inverter and a second control power supply line that is connected to an input terminal of the further inverter, the first and second control power supply lines being maintained at different potentials.

8. The chopper comparator circuit of claim 5, wherein the second stage output node is connected to the comparator circuit output terminal.

* * * * *